United States Patent [19]

O'Connell

[11] 4,323,809
[45] Apr. 6, 1982

[54] SURFACE ACOUSTIC WAVE SUBSTRATE HAVING ORTHOGONAL TEMPERATURE COMPENSATED PROPAGATION DIRECTIONS AND DEVICE APPLICATIONS

[75] Inventor: Robert M. O'Connell, Columbia, Mo.

[73] Assignee: The United States of America as represented by the Secretary of the Air Force, Washington, D.C.

[21] Appl. No.: 105,362

[22] Filed: Dec. 19, 1979

[51] Int. Cl.$^3$ .............................................. H01L 41/08
[52] U.S. Cl. .................................. 310/313 A; 333/155
[58] Field of Search ....................... 310/313 R, 313 A; 333/150, 154, 155

[56] References Cited

U.S. PATENT DOCUMENTS 3,956,718  5/1976  Weinert et al. ............ 310/313 A X
3,999,147  12/1976  Otto et al. .................. 310/313 A X

OTHER PUBLICATIONS

*Effects of Temperature-Dependent Anisotropy in RAC Devices and a cut of Quartz for a Temperature-Compensated RAC*, by D. E. Oats & R. C. Williamson, 1979 Ultrasonics Symposium Proceedings.
*The use of Surface-Elastic Wave Reflection Gratings in Large Time-Bandwidth Pulse Compression Filters*, Richard Williamson et al., IEEE Transactions on Microwave Theory and Techniques, vol. MIT-21, No. 4, Apr. 1972.

*Primary Examiner*—Mark O. Budd
*Attorney, Agent, or Firm*—Donald J. Singer; Willard R. Matthews, Jr.

[57] ABSTRACT

Surface acoustic wave devices such as reflective array compressors which utilize orthogonal propagation directions are improved by employing a substrate member the surface acoustic wave propagation surface of which exhibits zero temperature coefficient of delay in two orthogonal directions. Temperature compensation means are eliminated and improved performance in relaized by aligning the principal and secondary axes of propagation of the device with the zero temperature coefficient of delay directions. A single cut quartz substrate having its propagation surface defined by a plane coinciding with the Euler angles lambda=0.0°; mu=125.87 (+1−6)°, theta=45.0° enables realization of the concept with reflective array compressors and other reflective quartz devices.

2 Claims, 7 Drawing Figures

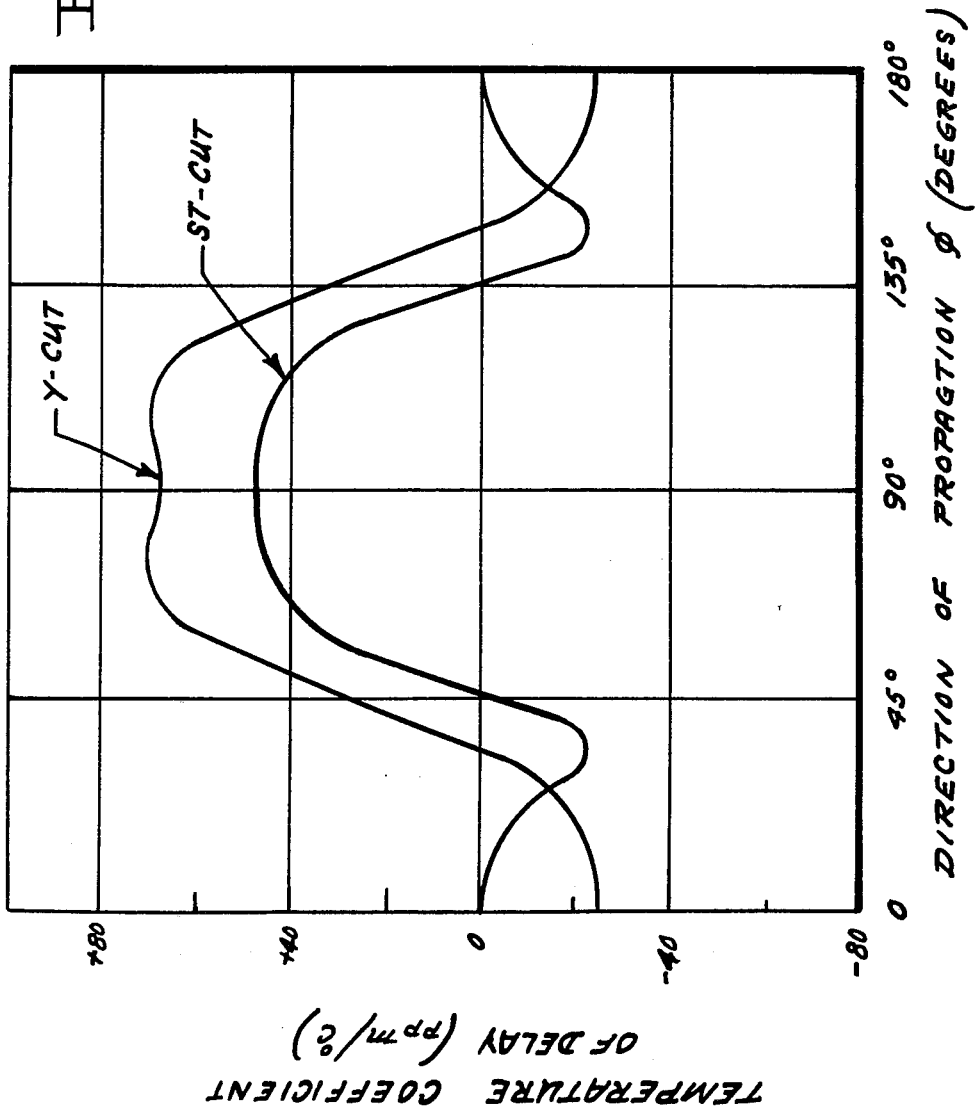

SURFACE ACOUSTIC WAVE SUBSTRATE HAVING ORTHOGONAL TEMPERATURE COMPENSATED PROPAGATION DIRECTIONS AND DEVICE APPLICATIONS

STATEMENT OF GOVERNMENT INTEREST

The invention described herein may be manufactured and used by or for the Government for governmental purposes without the payment of any royalty thereon.

BACKGROUND OF THE INVENTION

This invention relates to surface acoustic wave technology and in particular to a substrate comprised of a new cut of quartz having orthogonal temperature compensated propagation directions. The invention also relates to the application of substrates of that type to reflective array compressors and other surface acoustic wave reflective grating devices.

The use of multiple paths in surface acoustic wave devices is attractive because it provides good rejection of spurious signals and second order effects, however, it also places an additional condition on the substrate material if the device is to be temperature-stable without thermostatting. In the operation of a general reflection-grating device, the acoustic wave launched at an input interdigital transducer makes two 90°, reflections from the gratings and propagates along the orthogonal paths before reaching the output transducer. For temperature stability, it is necessary first that the substrate material be temperature compensated along the primary propagation axis; this is the usual requirement for temperature-stability of the dispersive delay. In addition, to avoid serious reductions in the amplitude of the output signal it is necessary that the temperature coefficients of delay along both propagation paths be equal. To meet both of these requirements, it is therefore necessary that the substrate be temperature-compensated along both propagation paths.

Since surface acoustic wave substrate materials are in general anisotropic, the requirement for temperature-compensated orthogonal propagation directions is not usually satisfied. On the popular ST-cut of quartz, for example, the temperature coefficient of delay along the direction orthogonal to the temperature-compensated X-axis is 47 ppm/°c; hence, orthogonal-direction surface acoustic wave devices built on ST-cut quartz must be thermostatted. It appears, in fact, that no surface acoustic wave cut of any material has previously been found which is temperature-compensated along two orthogonal directions.

The present invention is directed toward filling that need.

SUMMARY OF THE INVENTION

The invention comprehends the elimination of temperature compensation means in surface acoustic wave reflective grating devices by means of orienting the input and output transducers and reflective gratings on the substrate propagation surface such that the principal and secondary axes of propagation are aligned with orthogonal zero temperature coefficient of delay directions. The invention also comprehends a particular cut of single crystal quartz having orthogonal temperature compensated propagation directions that permits device implementation;

It is a primary object of the invention to provide a new and improved reflective grating surface acoustic wave device.

It is another object of the invention to provide a new and improved surface acoustic wave reflective array compressor.

It is another object of the invention to provide a reflective grating surface acoustic wave device that does not require temperature compensation.

It is another object of the invention to provide a surface acoustic wave substrate member having zero temperature coefficient of delay in two orthogonal directions.

It is another object of the invention to provide a single cut quartz surface acoustic wave substrate member having zero temperature coefficient of delay in two orthogonal directions that can be easily fabricated.

These, together with other objects features and advantages of the invention, will become more readily apparent from the following detailed description when taken in conjunction with the illustrative embodiment of the accompanying drawings.

DESCRIPTION OF THE DRAWINGS

FIG. 4 illustrates curves showing the variation of temperature coefficient of time delay in the planes of Y cut and ST cut quartz.

DETAILED DESCRIPTION OF THE PREFERRED EMBODIMENT

Figure 1:
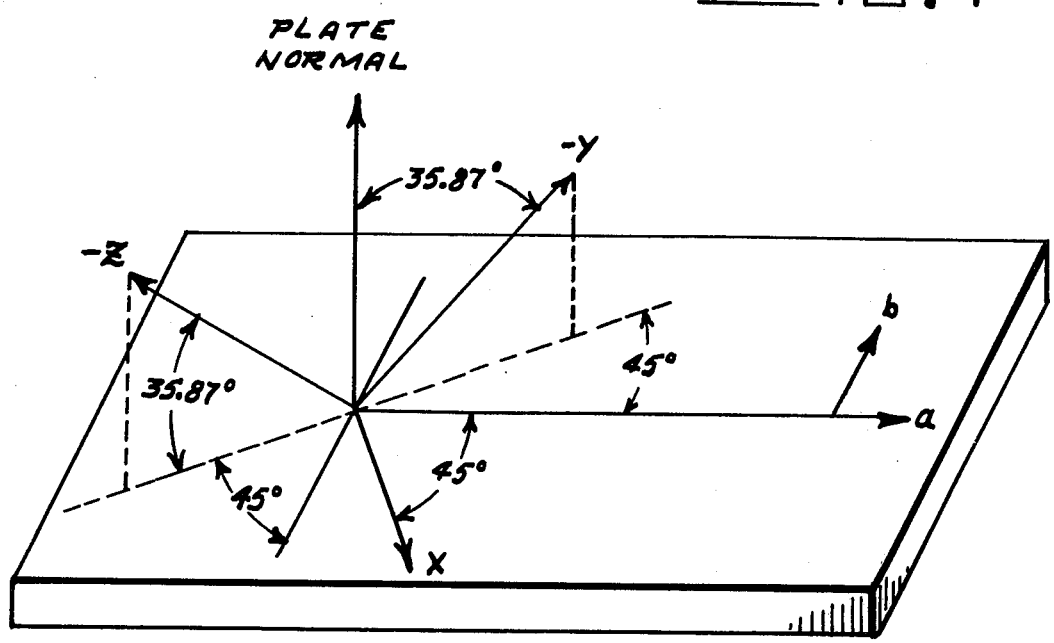
FIG. 1 is a sketch of the crystal cut of the invention showing the relationship among the XYZ crystal axes, the plate normal, and the primary and secondary directions of a reflective array device.

A surface acoustic wave (SAW) substrate consisting of a new cut of single crystal quartz which is temperature compensated along two orthogonal directions has been developed. This new cut finds great utility in reflection grating devices such as the reflective array compressor (RAC), in which orthogonal propagation paths are required. Except for a small electromechanical power flow angle, the SAW properties along the two temperature-compensated directions are similar to those of X-propagating, ST-Cut quartz. Because the attractive propagation paths lie in the plane of a single-rotated crystal-cut, it is relatively easy and inexpensive to manufacture. The Euler angle $\lambda = 0.0°$, $\mu = 125.87(+1-6)°$, $\theta = 45.0°$ define the crystal cuts of the invention. A sketch of this crystal cut, showing the relationship among the XYZ crystal axes, the plate normal, and the primary and secondary propagation directions is shown in FIG. 1.

Figure 2A:
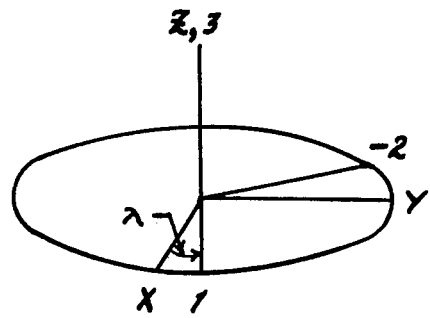
FIGS. 2a, 2b, and 2c illustrate the coordinate system used to define acoustic surface wave propagation in terms of Euler angles.
Figure 2B:
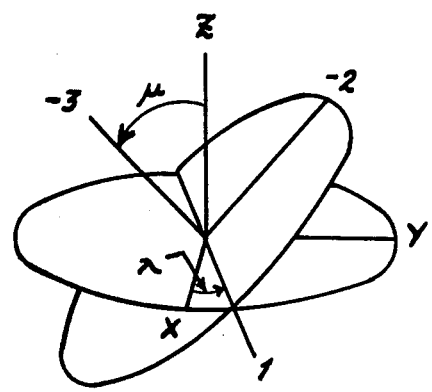
Figure 2C:
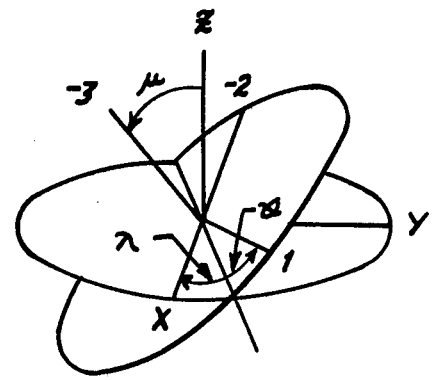

Euler angles are described in FIGS. 2a, 2b, and 2c. To establish a given crystallographic orientation, the propagation axes 1, −2, −3 are transferred relative to the crystalline axes X, Y, Z with which they are initially aligned, by means of three successive rotations performed in a specific sequence. The angles of the rotations in this sequence are defined as the Euler angles.

The transformation sequence begins by rotating the 1 and −2 axes counterclockwise about the Z axis through angle λ. Next, the −2 and −3 axes are rotated counterclockwise about the 1 axis and through angle μ. Finally, the 1 and −2 axes are rotated counterclockwise about the −3 axis through angle θ. The resultant direction of the 1 axis defines the phase velocity vector or the direction of propagation and the resultant direction of the −3 axis defines the plate normal.

Figure 3:
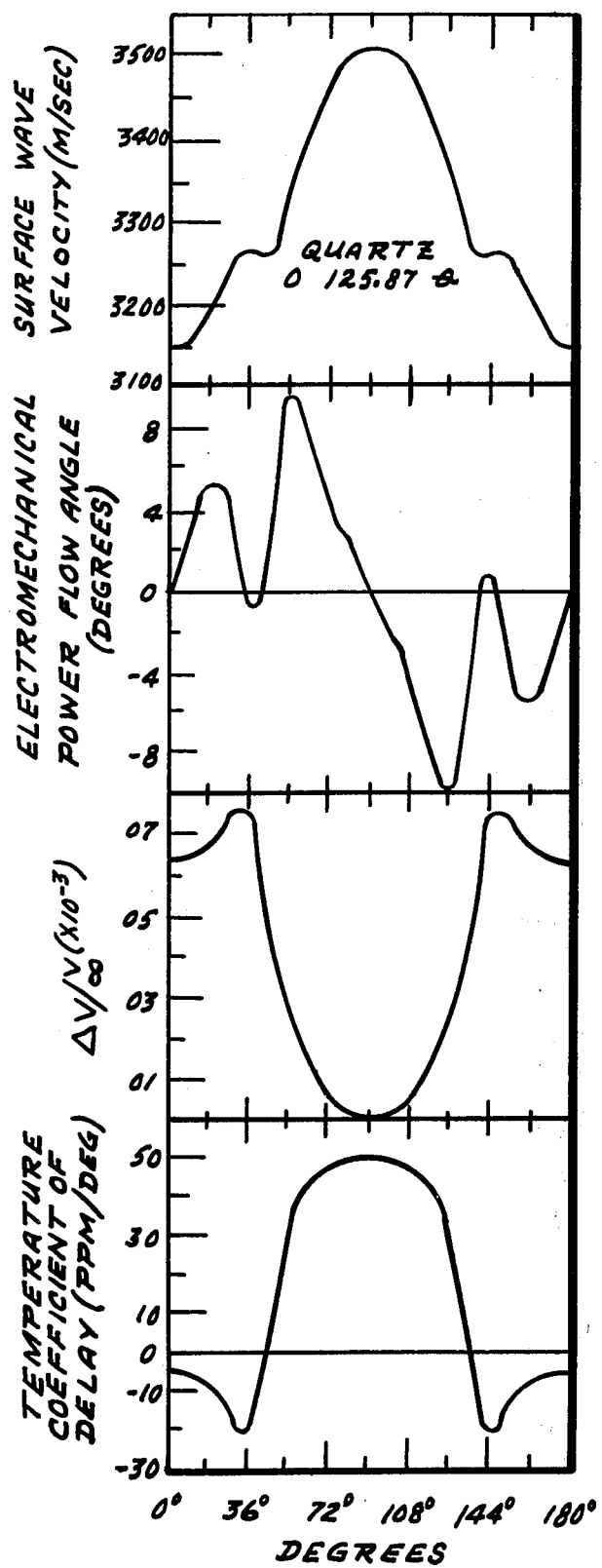
FIG. 3 illustrates the curves of surface wave velocity, electromechanical power flow angle, piezoelectric coupling constant and temperature coefficient of delay in the plane of the crystal cut of the invention.

The variation of SAW velocity, electromechanical power flow angle, ΔV/V piezoelectric coupling constant, and temperature coefficient of delay (TCD) in the plane of the cut comprehended by the invention are shown in FIG. 3. It is noted that the TCD is zero along the two orthogonal propagating directions θ=45° and 135°. For reflection grating device design the primary (principal or incident) and secondary axes of propagation should be aligned along these directions. The variation of temperature coefficient of time delay in the planes of Y cut and ST cut quartz is illustrated by the curves of FIG. 4. It is noted that each curve is symmetric about a direction of propagation θ, equal to 90° and that the TCD at θ=45° (and 135°) for the Y cut is opposite in sign to that for the ST cut.

TABLE I

| Crystal Cut | Euler Angles | | | TCD (ppm/°C.) | Velocity (m/sec) | Piezoelectric Coupling (ΔV/V) (× 10³) | Power Flow Angle (deg) |
|---|---|---|---|---|---|---|---|
| | λ | μ | θ | | | | |
| New RAC Cut | 0.0 | 125.87 | 45.0 | 0.0 | 3267 | 0.51 | +3.46 |
| | 0.0 | 125.87 | 135.0 | 0.0 | 3267 | 0.51 | −3.46 |
| ST-Cut | 0.0 | 132.75 | 0.0 | 0.0 | 3158 | 0.58 | 0.0 |

The SAW properties along the attractive orthogonal directions for this new cut are listed in Table I, along with the corresponding values for ST cut quartz for comparison.

It is noted that while the velocities and ΔV/V coupling values are very similar the new cut has a small but non-zero electromechanical power flow angle along each of its temperature compensated directions. Depending on the specific device design this may necessitate a slight shift of either the reflective gratings, the output transducer, or both.

As is the case with any new SAW crystal cut, theoretical values for the defining Euler angles are only approximate. For this new cut uncertainty exists only in the value of the second Euler angle μ, the rotation angle of the plate normal indicated as nominally 125.87°.

The plate normal μ for zero TCD was found to vary by approximately 5° from the nominal value. The precise value of therefore must be determined experimentally.

The development of improved RAC devices does not depend upon the experimental determination of the exact value of μ however. One of the more serious problems in RAC design is that temperature variations cause a misalignment of the angle of the reflective gratings in proportion to the difference between the TCDs along the two propagation paths; this results in reduction of the amplitude of the output signal of the device.

Since the TCDs at θ=45° and 135° in the planes of rotated Y cuts are equal (see FIGS. 1 and 4) their differences are zero and the amplitude reduction problem is minimized independently of the value of μ. The TCDs at θ=45° and 135° in the plane of the new cut defined by Euler angle λ=0° and μ=125.87° are certainly small, if not zero, and equal. Thus, it is possible to build greatly improved unthermostatted RAC devices without obtaining the results of the above-mentioned experimental determination of μ.

Figure 5:
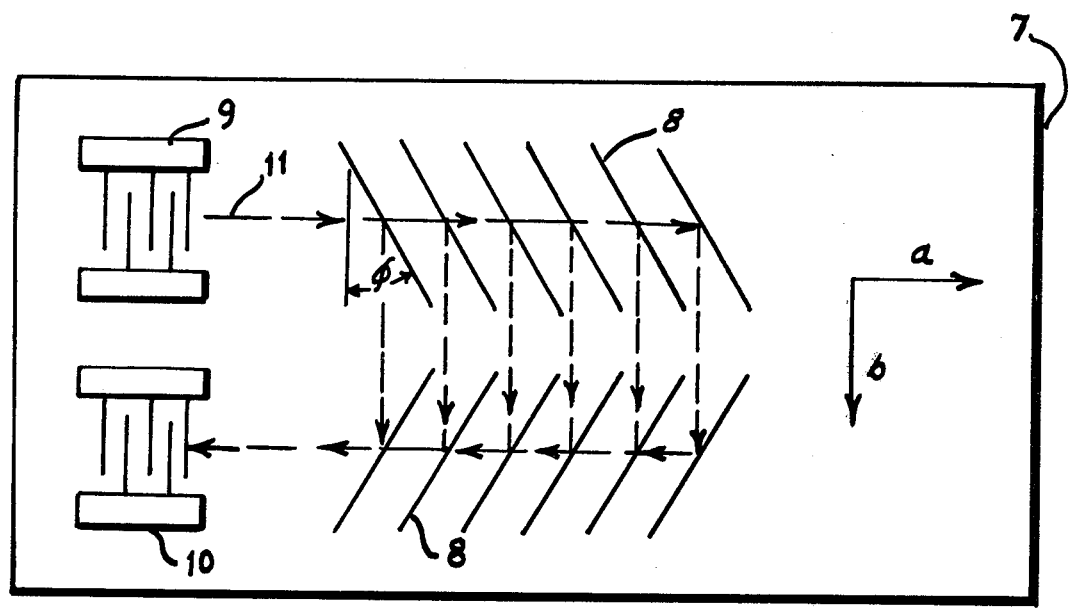
FIG. 5 illustrates schematically a reflective grating SAW device incorporating the principles of the invention.

FIG. 5 illustrates schematically a general reflection grating SAW device of the type comprehended by the invention. It comprises substrate member 7, input transducer 9, output transducer 10 and reflection grating 8. Substrate member 7 is comprised of any appropriate SAW substrate material having a surface acoustic wave propagating surface that has equal or zero temperature coefficient of time delay in two non-parallel or orthogonal directions. In accordance with the principles of the invention input and output transducers and the reflection gratings are aligned such that the principal (a) and secondary (b) axes of propagation coincide with the zero TCD directions of the substrate member 7. In operation, the acoustic signal shown by dashed lines 11 makes two 90° reflections and propagates along the orthogonal paths a and b before reaching the output transducer 10.

Further details of the invention and its development are given in the periodical article of Robert M. O'Connell entitled *A New Surface-Acoustic Wave Cut of Quartz With Orthogonal Temperature Compensated Propagation Directions*, published in Applied Physics Letters 35 (3) pp. 217–219 August 1979, which article is incorporated herein by reference.

While the invention has been described in one presently preferred embodiment, it is understood that the words which have been used are words of description rather than words of limitation and that changes within the purview of the appended claims may be made without departing from the scope and spirit of the invention in its broader aspects.

What is claimed is:

1. A reflective grating surface acoustic wave device comprising
   a substrate member having a surface acoustic wave propagating surface and an equal temperature coefficient of delay in two non-parallel directions on said propagation surface, said substrate member comprising a single crystal quartz member having an acoustic surface wave propagation surface defined by a plane that substantially coincides with the Euler angles Lambda=0.0°, mu=125.87 (+1−6)°, Theta=45/0°,
   an input transducer on said propagation surface,
   an output transducer on said propagation surface, and
   reflective grating means on said propagation surface,
      the principal and secondary axes of propagation of said device being aligned with equal temperature coefficient of delay directions.

2. A surface acoustic wave device substrate member of single crystal quartz having an acoustic surface wave propagation surface defined by a plane that substantially coincides with the Euler angle Lambda=0.0°, mu=125.87 (+1−6)° and Theta=45.0°.

* * * * *